(12) United States Patent
Höhn et al.

(10) Patent No.: US 12,708,003 B2
(45) Date of Patent: Aug. 11, 2026

(54) SUBSTRATE

(71) Applicant: Infineon Technologies AG, Neubiberg (DE)

(72) Inventors: Alexander Höhn, Soest (DE); Charles Rimbert-Riviere, Soest (DE)

(73) Assignee: Infineon Technologies AG, Neubiberg (DE)

( * ) Notice: Subject to any disclaimer, the term of this patent is extended or adjusted under 35 U.S.C. 154(b) by 364 days.

(21) Appl. No.: 18/442,135

(22) Filed: Feb. 15, 2024

(65) Prior Publication Data

US 2024/0290707 A1 Aug. 29, 2024

(30) Foreign Application Priority Data

Feb. 23, 2023 (EP) .................................... 23158108

(51) Int. Cl.
*H10W 70/65* (2026.01)

(52) U.S. Cl.
CPC .................................. *H10W 70/65* (2026.01)

(58) Field of Classification Search
CPC .................................................... H10W 70/60
USPC .......................................................... 174/250
See application file for complete search history.

(56) References Cited

U.S. PATENT DOCUMENTS 5,403,651 A 4/1995 Miyagi
2002/0179329 A1* 12/2002 Fukuoka ................ H05K 1/162 174/250
2015/0092380 A1* 4/2015 Hohlfeld ................. H05K 1/11 361/783

FOREIGN PATENT DOCUMENTS

DE 4004844 C1 1/1991

* cited by examiner

*Primary Examiner* — Andargie M Aychillhum
(74) *Attorney, Agent, or Firm* — Murphy, Bilak & Homiller, PLLC

(57) ABSTRACT

A substrate includes a dielectric insulation layer, a first metallization layer arranged on a first surface of the dielectric insulation layer, and a second metallization layer arranged on a second, opposite surface of the dielectric insulation layer. The dielectric insulation layer includes an outer edge extending between the first and second surfaces. The outer edge includes first sections and second sections. Along each first section, a difference between a first distance and a second distance has a first value. Along each second section, the difference between the first and second distances has a second value that is different from the first value. The first distance is a distance between the outer edge of the dielectric insulation layer and an outer edge of the first metallization layer. The second distance is a distance between the outer edge of the dielectric insulation layer and an outer edge of the second metallization layer.

14 Claims, 4 Drawing Sheets

42
100
7
4
5
3
41
30
20
20
111
11
10
112
12
y
x d1
D - D'
diff12
101
1113
113
111
11
10
1123
112
102
y
d2
x d1
E - E'
diff12
101
1113
113
111
11
10
1123
112
d2
102
y
x

SUBSTRATE

TECHNICAL FIELD

The instant disclosure relates to a substrate, in particular to a substrate for a power semiconductor module arrangement.

BACKGROUND

Power semiconductor module arrangements often include at least one substrate arranged in a housing. A semiconductor arrangement including a plurality of controllable semiconductor elements (e.g., IGBTs, MOSFETs, HEMTs, etc.) may be arranged on each of the at least one substrate. Each substrate usually comprises a substrate layer (e.g., a ceramic layer), a first metallization layer deposited on a first side of the substrate layer, and a second metallization layer deposited on a second side of the substrate layer. The controllable semiconductor elements are mounted, for example, on the first metallization layer. The second metallization layer may be attached to a base plate. The size of the first metallization layer may be as large as possible in order to provide a large mounting surface for the semiconductor bodies and any other devices of the power semiconductor module arrangement. The size of the second metallization layer on the other hand may be chosen to be smaller than the size of the first metallization layer in order to reduce a size of the solder area when mounting the substrate to a base plate (or a heat sink), thereby reducing the risk of solder leak and/or solder splash. Similarly, it may however also be possible that the size of the second metallization layer is larger than the size of the first metallization layer for any other reasons. When a distance between the edge of the substrate layer and the edge of the second metallization layer is larger (or smaller) than a distance between the edge of the substrate layer and the edge of the first metallization layer, this is usually referred to as "pull-back". Such a pull-back, however, may increase the risk of cracks forming in the first and/or second metallization layer, especially when the metallization layers are heated to temperatures above defined threshold temperatures.

There is a need for a substrate that offers the advantages of a pull-back design while, at the same time, having a decreased risk of cracks forming in the first and/or second metallization layers.

SUMMARY

A substrate includes a dielectric insulation layer, a first metallization layer arranged on a first surface of the dielectric insulation layer, and a second metallization layer arranged on a second surface of the dielectric insulation layer, opposite the first surface. The dielectric insulation layer comprises an outer edge extending between the first surface and the second surface, wherein the outer edge of the dielectric insulation layer comprises a plurality of first sections and a plurality of second sections. Along each of the plurality of first sections, a difference between a first distance and a second distance has a first value, and along each of the plurality of second sections, the difference between the first distance and the second distance has a second value that is different from the first value, wherein the first distance is a distance between the outer edge of the dielectric insulation layer and an outer edge of the first metallization layer, and the second distance is a distance between the outer edge of the dielectric insulation layer and an outer edge of the second metallization layer.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figures 1, 2A, 2B:
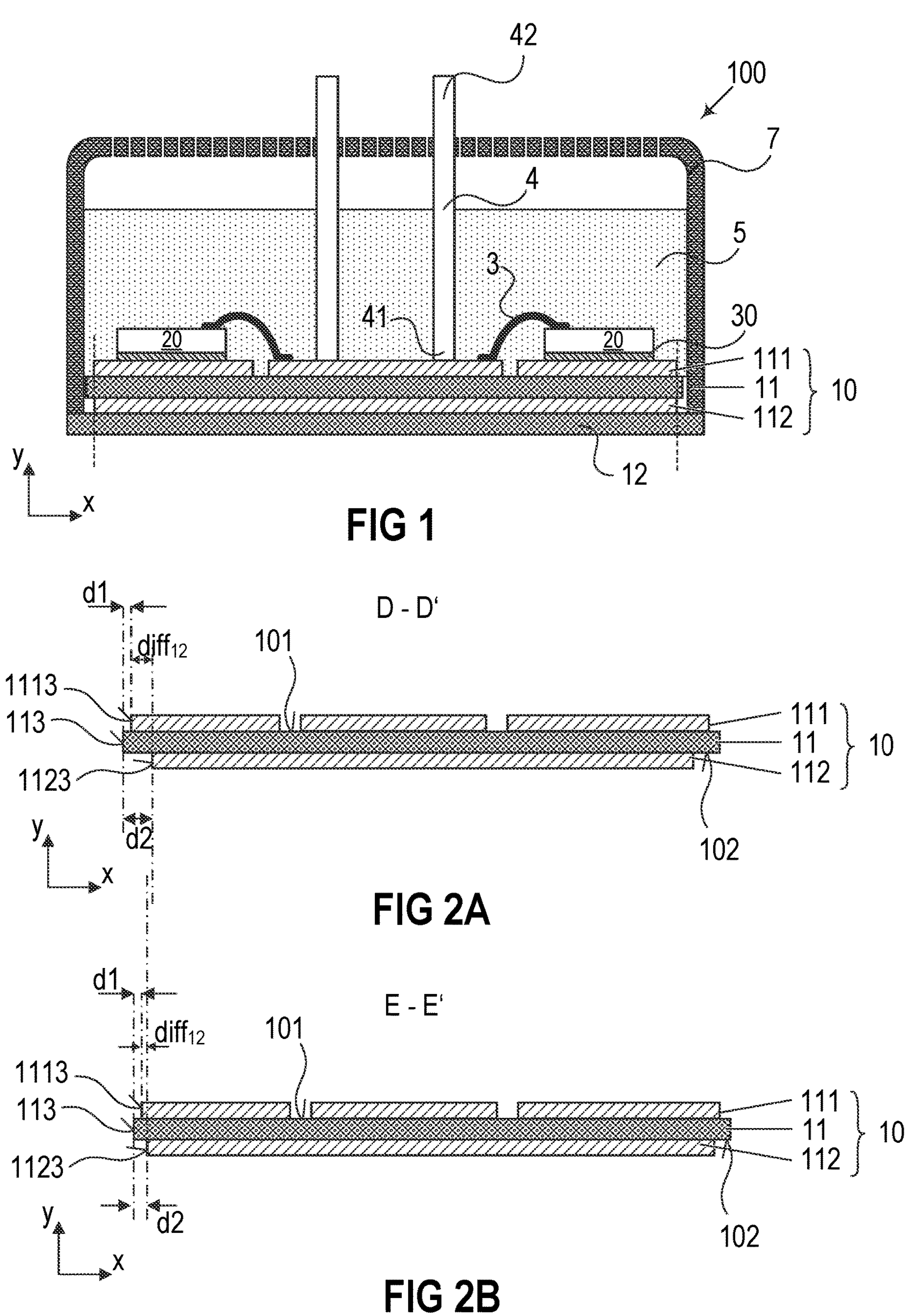
FIG. 1 is a cross-sectional view of a power semiconductor module arrangement.
FIGS. 2A and 2B schematically illustrate different cross-sectional views of a substrate.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises sidewalls and a cover. This, however, is only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7. It is also possible that the substrate 10 itself forms a ground surface of the housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connection elements 3 such as, e.g., bonding wires or bonding ribbons. Electrical connections 3 may also include connection plates, conductor rails, or connection clips, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example. According to other examples, it is also possible that the second metallization layer 112 is a structured layer.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example.

The power semiconductor module arrangement 100 may further include an encapsulant 5. An encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 42, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

In the example illustrated in FIG. 1, a size of the second metallization layer 112 equals a size of the first metallization layer 111. That is, a distance between an outer edge of the dielectric insulation layer 11 and an outer edge of the first metallization layer 111 equals a distance between the outer edge of the dielectric insulation layer 11 and an outer edge of the second metallization layer 112 along the entire circumference of the dielectric insulation layer 11. Or, in other words, the outer edge of the first metallization layer 111 is aligned with the outer edge of the second metallization layer 112, as is emphasized by the dashed lines in FIG. 1.

Usually, the size of the first metallization layer 111 is as large as possible in order to provide a large mounting surface for the semiconductor bodies 20 and any other devices (e.g., terminal elements 4) of the power semiconductor module arrangement. The size of the second metallization layer 112 on the other hand may be chosen to be smaller than the size of the first metallization layer 111 in order to reduce a size of the solder area when mounting the substrate 10 to a base plate 12, thereby reducing the risk of solder leak and/or solder splash. That is, the distance d1 between the outer edge 113 of the dielectric insulation layer 11 and the outer edge 1113 of the first metallization layer 111 may be less than the distance d2 between the outer edge 113 of the dielectric insulation layer 11 and the outer edge 1123 of the second metallization layer 112 along the entire circumference of the dielectric insulation layer 11, as is exemplarily illustrated in the cross-sectional view of FIG. 2A. Similarly, for any reasons, it may however also be possible that the size of the second metallization layer 112 is larger than the size of the first metallization layer 111 such that the distance d1 between the outer edge 113 of the dielectric insulation layer 11 and the outer edge 1113 of the first metallization layer 111 is greater than the distance d2 between the outer edge 113 of the dielectric insulation layer 11 and the outer edge 1123 of the second metallization layer 112 along the entire circumference of the dielectric insulation layer 11 (not specifically illustrated).

When a distance d2 between the outer edge 113 of the dielectric insulation layer 11 and the outer edge 1123 of the second metallization layer 112 is larger (or smaller) than a distance d1 between the outer edge 113 of the dielectric insulation layer 11 and the outer edge 1113 of the first metallization layer 111, this is usually referred to as "pull-back". Such a pull-back, however, may increase the risk of cracks forming in the first and/or second metallization layers 111, 112, especially when the metallization layers 111, 112 are heated to temperatures above defined threshold temperatures. This is, because the pull-back may result in high tensions in the dielectric insulation layer 11. Such tensions may be further influenced by a temperature of the substrate 10 due to the so-called bi-metallic effect (increased tension at higher temperatures).

Now referring to FIGS. 2A and 2B, different cross-sectional views of a substrate 10 according to embodiments of the disclosure are schematically illustrated. The substrate 10 comprises a dielectric insulation layer 11, a first metallization layer 111 arranged on a first surface 101 of the dielectric insulation layer 11, and a second metallization layer 112 arranged on a second surface 102 of the dielectric insulation layer 11, opposite the first surface 101. The dielectric insulation layer 11 comprises an outer edge 113 extending between the first surface 101 and the second surface 102, wherein the outer edge 113 of the dielectric insulation layer 11 comprises a plurality of first sections A and a plurality of second sections B (see, e.g., top view of substrate illustrated in FIG. 3). Along each of the plurality of first sections A, a difference $diff_{12}$ between a first distance d1 and a second distance d2 has a first value v, and along each of the plurality of second sections B, the difference $diff_{12}$ between the first distance d1 and the second distance d2 has a second value w that is different from the first value (v≠w). The first distance d1 is a distance between the outer edge 113 of the dielectric insulation layer 11 and an outer edge 1113 of the first metallization layer 111, and the second distance d2 is a distance between the outer edge 113 of the dielectric insulation layer 11 and an outer edge 1123 of the second metallization layer 112.

That is, along the first sections A $$diff_{12} = |d1 - d2| = v,$$

and along the second sections B $$diff_{12} = |d1 - d2| = w,$$

wherein, v≠w.

According to one embodiment of the disclosure, the following may apply: v>w (first value v greater than second value w).

Figure 3:
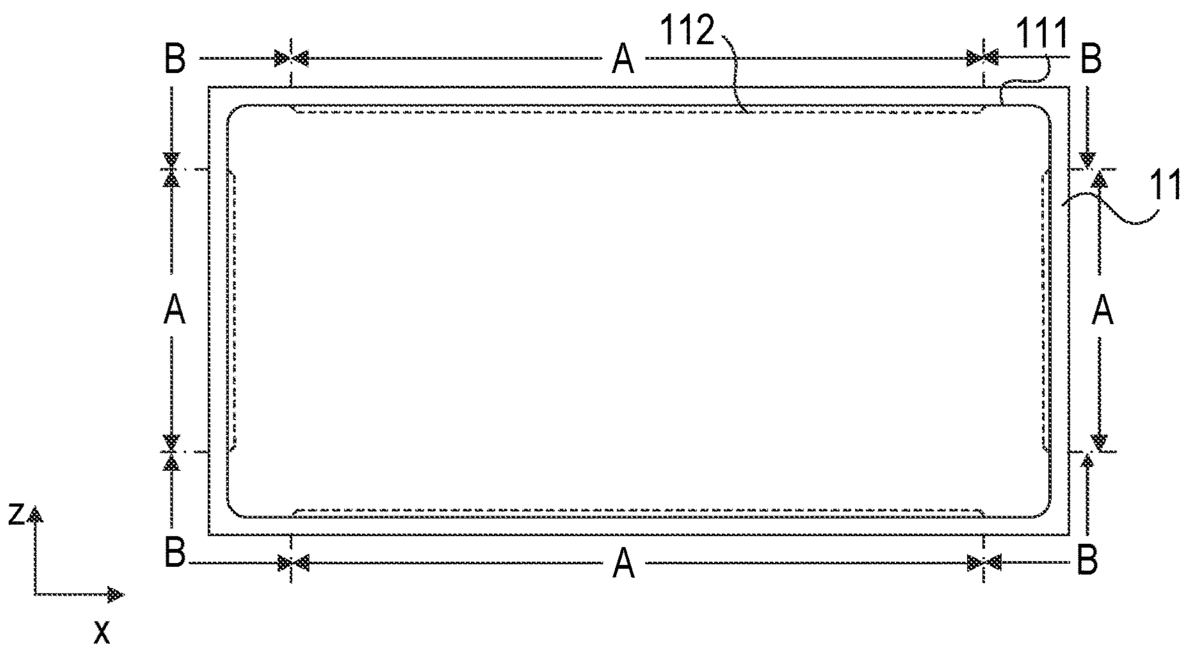
FIG. 3 is a top view of a substrate according to embodiments of the disclosure.
Figure 4:
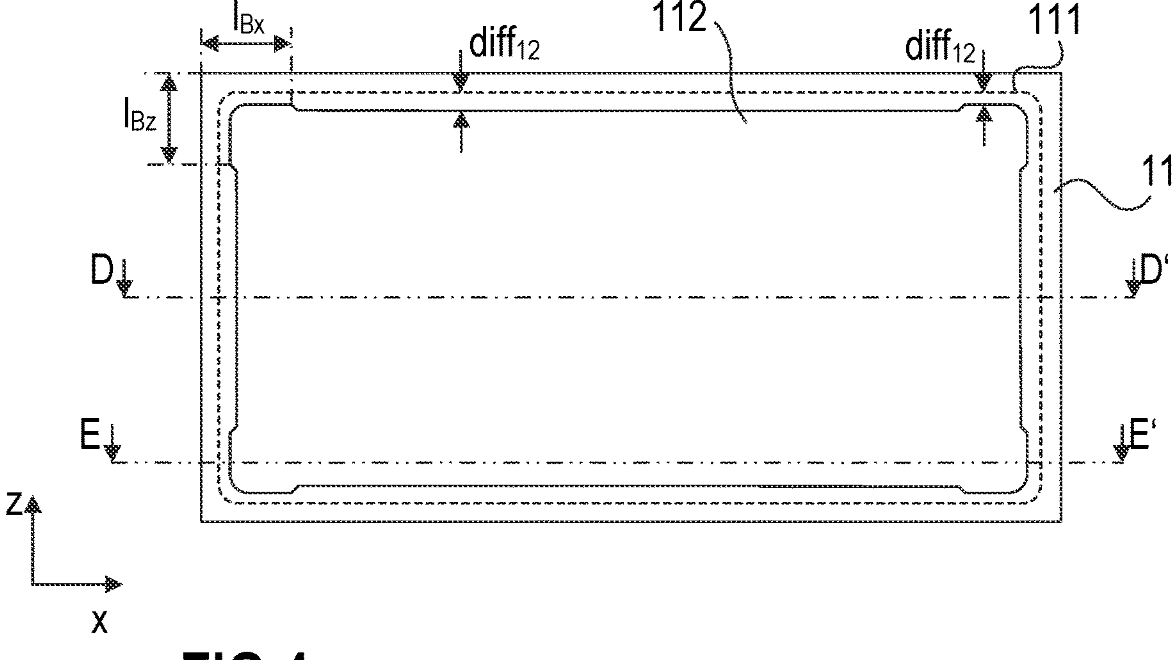
FIG. 4 is a bottom view of a substrate according to further embodiments of the disclosure.

The first sections A may be referred to as pull-back sections or full pull-back sections, and the second sections B may be referred to as no pull-back sections or reduced pull-back sections, for example. By providing sections with a full pull-back as well as sections with a reduced or even no pull-back, the advantages of the pull-back design are combined with the advantages of a no-pullback design or at least a reduced pull-back design. That is, in the second sections B, the tensions arising in the dielectric insulation layer 11 may be significantly reduced while still providing the advantages of the pull-back design along the first sections A. Top and bottom views of substrates 10 according to embodiments of the disclosure are schematically illustrated in FIG. 3 (no pull-back design in second sections B) and FIG. 4 (reduced pull-back design in second sections B). FIG. 3 schematically illustrates a top view in which the first metallization layer 111 is visible, while the second metallization layer 112 (illustrated in dashed lines) is concealed by the first metallization layer 111 and the dielectric insulation layer 11. FIG. 4 schematically illustrates a bottom view of a substrate 10 in which the second metallization layer 112 is visible, while the first metallization layer 111 (illustrated in dashed lines) is concealed by the second metallization layer 112 and the dielectric insulation layer 11. FIG. 2A schematically illustrates a cross-sectional view along a section line D-D', and FIG. 2B schematically illustrates a cross-sectional view along a section line E-E' of the substrate 10 as illustrated in FIG. 4.

Figure 6:
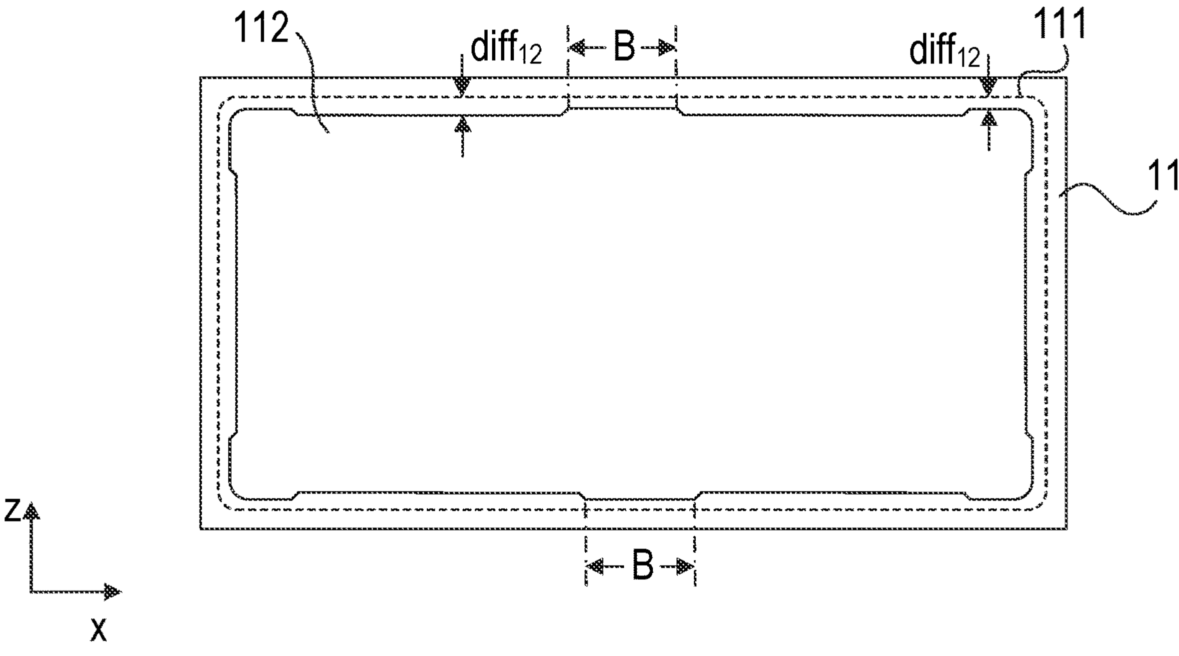
FIG. 6 is a bottom view of a substrate according to further embodiments of the disclosure.

As can be seen in FIGS. 3 and 4, for example, the first sections A and the second sections B are arranged alternatingly along the circumference of the dielectric insulation layer 11. The substrate 10 may comprise at least two first sections A and at least two second sections B, for example. The number of first sections A generally equals the number of second sections B. The dielectric insulation layer 11 may have a rectangular shape, and each of the second sections B may be arranged at a different corner of the dielectric insulation layer 11, for example, as is schematically illustrated in FIGS. 3 and 4. This, however, is only an example. Alternatively or additionally, second sections B may also be arranged anywhere along the sides of the dielectric insulation layer 11, as is schematically illustrated in FIG. 6. A length of a second section B extending along a side of the dielectric insulation layer 11, however, is less than the length of the respective side of the dielectric insulation layer 11. For example, a length of a second section B extending along a side of the dielectric insulation layer 11 may be less than 50% or even less than 30% of the respective side of the dielectric insulation layer 11.

The substrate 10 illustrated in FIG. 6 comprises one additional second section B along each of the longitudinal sides of the dielectric insulation layer 11 (a rectangular dielectric insulation layer 11 generally comprises two longitudinal sides extending in parallel to each other, and two narrow sides extending in parallel to each other and perpendicular to the longitudinal sides). Additionally or alternatively, second sections B may be arranged anywhere along the circumference of the dielectric insulation layer 11. It is also possible that two or more second sections B are arranged along one side of the dielectric insulation layer 11. Generally, second sections B with a reduced pull-back or no pull-back may be arranged in those sections along the circumference of the dielectric insulation layer 11 that are particularly sensitive and prone to cracks forming in the first and/or second metallization layers 111, 112.

The corners of the metallization layers 111, 112, for example, may be particularly sensitive and prone to the formation of cracks in a pull-back design. With the second sections B extending along the corners of the dielectric insulation layer 11, as illustrated in FIGS. 3 and 4, the formation of cracks in the area of the corners of the metallization layers 111, 112 may be significantly reduced or even entirely avoided. Each of the second sections B may extend from the respective corner in a first horizontal direction x and in a second horizontal direction z that is perpendicular to the first horizontal direction x (see, e.g., FIG. 4). According to one embodiment of the disclosure, a length $l_{Bx}$ of each of the second sections B in the first horizontal direction x may be less than 15 mm (Millimeters), and a length $l_{Bz}$ of each of the second sections B in the second horizontal direction z is less than 15 mm. According to another embodiment of the disclosure, the length $l_{Bx}$ of each of the second sections B in the first horizontal direction x may be less than 5 mm, and the length $l_{Bz}$ of each of the second sections B in the second horizontal direction z may be less than 5 mm. According to an even further embodiment of the disclosure, the length $l_{Bx}$ of each of the second sections B in the first horizontal direction x may be less than 3 mm, and the length $l_{Bz}$ of each of the second sections B in the second horizontal direction z may be less than 3 mm. The length $l_{Bx}$ of each of the second sections B in the first horizontal direction x may equal the length $l_{Bz}$ of each of the second sections B in the second horizontal direction z. It is, however, also possible that the length $l_{Bx}$ of a second section B in the first horizontal direction x differs from the length $l_{Bz}$ of the respective second sections B in the second horizontal direction z.

The first value v may be between 0.2 mm and 1.2 mm (millimeters), for example. That is, 0.2 mm≤v≤1.2 mm, for example. The second value w may be 50% of the first value v, or less. That is, w≤0.5*v, for example. When w=0.5*v, the pull-back is already significantly decreased, thereby also decreasing the tension along the second sections B. By further reducing the pull-back (e.g., 0<w<0.5*v), the tension may be decreased even further. If w=0, the respective second section B is a no pull-back section, and the tension may be reduced to a minimum. A no-pull back region, however, generally does not profit from the advantages of a pull-back at all. Whether the second sections B are implemented as reduced pull-back sections or no pull-back sections generally depends on the overall design of the power semiconductor module arrangement and the application it is used for. In some cases, reduced pull-back sections may be preferable, while in other cases no pull-back sections may be more appropriate.

Figure 5:
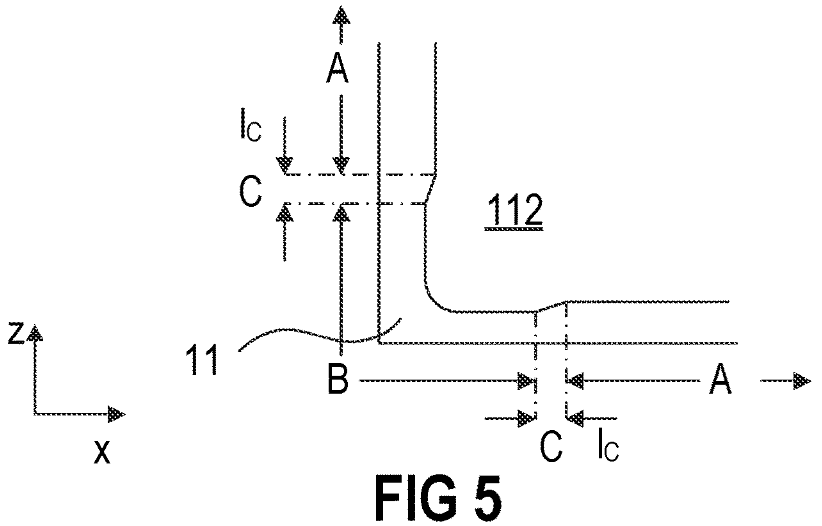
FIG. 5 schematically illustrates a top view of one corner of a substrate according to embodiments of the disclosure.

Now referring to FIG. 5, the dielectric insulation layer 11 may further comprise a plurality of third sections C, wherein each third section C is arranged between a first section A and a second section B. Along each of the third sections C, the difference $diff_{12}$ gradually transitions from the first value v to the second value w. That is, a transition between the first sections A and the second sections B may be comparably smooth. A length $l_C$ of a third section C (distance between first section A and second section B) may be between 0.1 and 5 mm (millimeters), for example. It is, however, also possible that the third sections C be omitted. That is, there may be a hard edge between the first sections A and the second sections B. A smooth transition between the first sections A and the second sections B by means of the third sections C, however, may further decrease the tension in the dielectric insulation layer 11.

Figure 7:
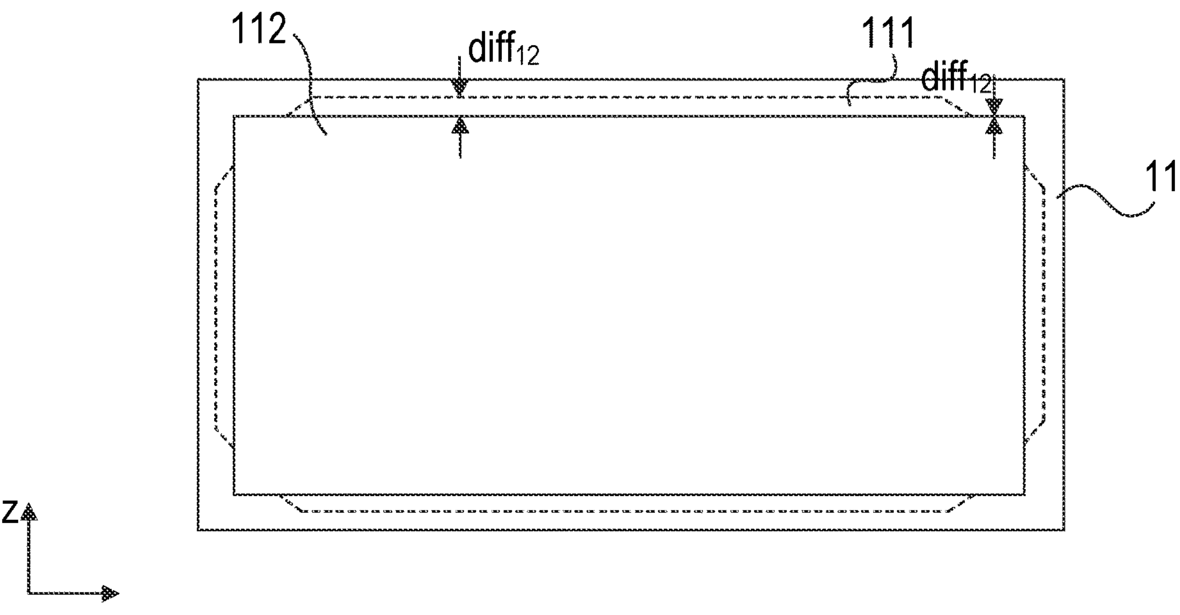
FIG. 7 is a bottom view of a substrate according to even further embodiment of the disclosure.

In the examples illustrated in FIGS. 3 to 6, the reduced pull-back or no pull-back sections (second sections) are implemented by decreasing the distance d2 between the outer edge 113 of the dielectric insulation layer and the outer edge 1123 of the second metallization layer 112. That is, the second metallization layer 112 comprises bulges or projections in the areas of the second sections B. It is, however, generally also possible to instead increase the distance d1 between the outer edge 113 of the dielectric insulation layer 11 and the outer edge 1113 of the first metallization layer 111, as is schematically illustrated in FIG. 7. That is, the first metallization layer 111 (as outlined in a dashed line in the bottom view of FIG. 7) may comprise dents or indentations in the areas of the second sections B.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to cover all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A substrate, comprising:

a dielectric insulation layer;

a first metallization layer arranged on a first surface of the dielectric insulation layer; and a second metallization layer arranged on a second surface of the dielectric insulation layer, opposite the first surface, wherein the dielectric insulation layer comprises an outer edge extending between the first surface and the second surface, wherein the outer edge of the dielectric insulation layer comprises a plurality of first sections and a plurality of second sections, wherein along each of the plurality of first sections, a difference between a first distance and a second distance has a first value, wherein along each of the plurality of second sections, the difference between the first distance and the second distance has a second value that is different from the first value, and wherein the first distance is a distance between the outer edge of the dielectric insulation layer and an outer edge of the first metallization layer, and the second distance is a distance between the outer edge of the dielectric insulation layer and an outer edge of the second metallization layer.

2. The substrate of claim 1, wherein the first sections and the second sections are arranged alternatingly along the circumference of the dielectric insulation layer.

3. The substrate of claim 1, wherein the dielectric insulation layer has a rectangular shape, and each of the second sections is arranged at a different corner of the dielectric insulation layer.

4. The substrate of claim 3, wherein each of the second sections extends from the respective corner in a first horizontal direction and in a second horizontal direction that is perpendicular to the first horizontal direction.

5. The substrate of claim 4, wherein a length of each of the second sections in the first horizontal direction is less than 15 mm, and wherein a length of each of the second sections in the second horizontal direction is less than 15 mm.

6. The substrate of claim 5, wherein the length of each of the second sections in the first horizontal direction is less than 5 mm, and wherein the length of each of the second sections in the second horizontal direction is less than 5 mm.

7. The substrate of claim 6, wherein the length of each of the second sections in the first horizontal direction is less than 3 mm, and wherein the length of each of the second sections in the second horizontal direction is less than 3 mm.

8. The substrate of claim 5, wherein the length of each of the second sections in the first horizontal direction equals the length of each of the second sections in the second horizontal direction.

9. The substrate of claim 1, wherein the first value is between 0.2 mm and 1.2 mm.

10. The substrate of claim 1, wherein the first value is greater than the second value.

11. The substrate of claim 10, wherein the second value is 50% of the first value or less.

12. The substrate of claim 11, wherein the second value is zero.

13. The substrate of claim 1, wherein the dielectric insulation layer further comprises a plurality of third sections, wherein each third section is arranged between a first section and a second section, and wherein along each of the third sections, the difference gradually transitions from the first value to the second value.

14. The substrate of claim 13, wherein a length of each of the third sections is between 0.1 mm and 5 mm.

* * * * *